US012578367B2

(12) United States Patent　　　　　(10) Patent No.:　US 12,578,367 B2

Li et al.　　　　　　　　　　　　　　　(45) Date of Patent:　Mar. 17, 2026

---

(54) POWER FLOW CALCULATION AND AC/DC HYBRID POWER FLOW CALCULATION METHOD FOR FLEXIBLE DC TRANSMISSION SYSTEM

(71) Applicant: SHANDONG UNIVERSITY, Jinan (CN)

(72) Inventors: Changgang Li, Jinan (CN); Zhenhe Ma, Jinan (CN); Yutian Liu, Jinan (CN); Hua Ye, Jinan (CN)

(73) Assignee: SHANDONG UNIVERSITY, Jinan (CN)

( * ) Notice: Subject to any disclaimer, the term of this patent is extended or adjusted under 35 U.S.C. 154(b) by 383 days.

(21) Appl. No.: 18/128,595

(22) Filed: Mar. 30, 2023

(65) Prior Publication Data

US 2024/0069078 A1　Feb. 29, 2024

(30) Foreign Application Priority Data

Aug. 15, 2022　(CN) .......................... 202210971967.9

(51) Int. Cl.
　*G01R 19/25*　　　(2006.01)
(52) U.S. Cl.
　CPC ................................ *G01R 19/2513* (2013.01)
(58) Field of Classification Search
　CPC .... H02J 3/36; H02J 2203/10; G01R 19/2513;
　　　　　　　　　　　　　　G01R 21/133; Y02E 60/60
　USPC ........................................................ 702/61
　See application file for complete search history.

(56) References Cited

U.S. PATENT DOCUMENTS

2020/0081044 A1 * 3/2020 Li ........................ G01R 21/003

OTHER PUBLICATIONS

Ma et al., "Extension of Power Flow Algorithm in STEPS for AC/DC Hybrid Power Systems with VSC-MTDC", Published in: 2021 IEEE/IAS Industrial and Commercial Power System Asia (I&CPS Asia) (Year: 2021).*

* cited by examiner

*Primary Examiner* — John H Le

(74) *Attorney, Agent, or Firm* — OLIFF PLC

(57)　　　　　　　ABSTRACT

A power flow calculation and AC/DC hybrid power flow calculation method for a flexible DC transmission system, the method including: according to the flexible DC transmission system under different control strategies, constructing a unified power flow model with a unified structure; determining a current main converter station, a current control strategy and an initial value and a limit value thereof, and forming the power balance equations under the current control strategy according to the unified power flow model; updating the current DC node voltage according to the voltage variation obtained by solving the power balance equations, and, if the updated DC node voltage exceeds the limit value, switching the control strategy; and if the updated DC node voltage does not exceed the limit value and the iteration constraints are not satisfied, alternating the main converter station according to the priority until iteration is completed.

9 Claims, 3 Drawing Sheets

POWER FLOW CALCULATION AND AC/DC HYBRID POWER FLOW CALCULATION METHOD FOR FLEXIBLE DC TRANSMISSION SYSTEM

TECHNICAL FIELD

The present disclosure relates to the technical field of power transmission systems, in particular to a power flow calculation and AC/DC hybrid power flow calculation method for a flexible DC transmission system.

BACKGROUND

The flexible DC transmission technology is a voltage source converter based HVDC (VSC-HVDC) transmission technology using fully controlled power electronic devices. Compared with the traditional DC transmission technology, the flexible DC transmission technology can have an access to the active system and the passive system, which can provide stable voltage support. There is no commutation failure problem, and the active power, the reactive power, etc. can be flexibly controlled, and it is a technical solution for scenarios such as flexible interconnection of power grids and large-scale renewable energy grid connection.

The system-level control strategies for flexible DC transmission include a master-slave control strategy, a voltage deviation control strategy, a voltage droop control strategy, a combined control strategy, etc. at present.

According to the master-slave control strategy, a certain converter station is used as the main converter station which uses a DC voltage control for balancing the active power of a system, while the rest of the converter stations use an active power control. If the power of the main converter station crosses the limit or the main converter station breaks down, the system will not be able to maintain a stable DC voltage and a system collapse will occur. The structure of master-slave control is simple, with high demand for communication, and low operational reliability of the system.

The existing power flow calculation for flexible DC transmission systems has the following shortcomings.

(1) Voltage source converters are flexible and controllable power electronic devices, and the voltage source converters in the same system can be combined to form at least 10 operating modes. Currently, there is still a lack of AC/DC power flow calculation methods for the flexible DC transmission system with multiple control strategies.

(2) Most of the original power flow calculation methods are focused on the basis of analyzing different single operating modes and lack a unified model for power flow calculation, and the power flow calculation method is relatively complicated after the operating modes of the converter station are switched.

(3) During the iterative calculation of the flexible DC transmission system power flow using the Newton-Raphson method, there may be the cases where the voltage or power of the balance converter station crosses the limit due to unreasonable initial data, and if the main converter station is replaced in this iteration, the final power flow calculation result may be affected.

SUMMARY

In order to solve the above problems, the present disclosure provides a power flow calculation and AC/DC hybrid power flow calculation method for a flexible DC transmission system. By constructing a unified power flow model, various control modes are represented, the power flow of a DC power grid containing multiple control strategies is calculated, and the control strategies can be easily and fast switched. The convergence of the power flow calculation of an AC/DC system is improved by inner-outer double-loop iteration in combination with the method of alternating main converter stations.

To achieve the foregoing objective, the present disclosure uses the following technical calculations:

In the first aspect, the present disclosure provides a power flow calculation method for a flexible DC transmission system, including:

according to the flexible DC transmission system under different control strategies, constructing a unified power flow model with a unified structure;

determining a current main converter station, a current control strategy and an initial value and a limit value thereof, and forming a power balance equation under the current control strategy according to the unified power flow model;

updating the current DC node voltage according to the voltage variation obtained by solving the power balance equations, and, if the updated DC node voltage exceeds the limit value, switching the control strategy; and if the updated DC node voltage does not exceed the limit value and the iteration constraints are not satisfied, alternating the main converter station according to the priority until iteration is completed.

As an alternative embodiment, the control strategies include a master-slave control strategy, a voltage deviation control strategy, an active power-voltage droop control strategy, and a current-voltage droop control strategy.

As an alternative embodiment, the power balance equations in the unified power flow model are:

$$\Delta P_i = P_{dci} + \alpha \cdot U_{dci} \left( I_{dcrefi} - \frac{U_{dci} - U_{dcrefi}}{k_{di}} \right) - \beta \frac{U_{dci} - U_{dcrefi}}{k_{dpi}} + P_{Gi} - P_{Li} -$$

$$U_{dci} \sum_{j=1}^{n} U_{dcj} G_{ij} (i = 1, 2, \ldots, n)$$

where $\Delta P_i$ is the imbalance power of a DC node i, $P_{dci}$ is the injection power from a converter station to the DC node i, $U_{dci}$ is the DC voltage of the DC node i, $P_{Gi}$ is the active power emitted by a power supply at the DC node i, $P_{Li}$ is the active power absorbed by a load at the DC node i, $G_{ij}$ is the admittance between the node i and a node j, $I_{dcrefi}$ is the direct current reference value of the DC node i, $k_{di}$ is a droop coefficient under the current-voltage droop control mode, $U_{dcrefi}$ is the DC voltage reference value of the DC node i, $k_{dpi}$ is a droop coefficient under the active power-voltage droop control mode, $U_{dcj}$ is the DC voltage of the DC node j, and n is the number of nodes; $\alpha$ and $\beta$ are adjustable variables.

As an alternative embodiment, in the unified power flow model, by changing the values of the adjustable variables $\alpha$ and $\beta$, the unified power flow model represents different control strategies.

In the second aspect, the present disclosure provides an AC/DC hybrid power grid power flow calculation method, including:

acquiring a current main converter station, a current control strategy and an initial value and a limit value thereof of a flexible DC transmission system, and performing power flow calculation of the flexible DC transmission system by using the method in the first aspect;

after the DC power flow iteration converges, performing power flow calculation of a voltage station, and for a converter station under DC voltage control or droop control, solving the active power and reactive power injected into an AC network by the converter station according to the active power injected into each DC node and a DC node voltage; and acquiring power flow data of an AC system, and performing AC power flow calculation, and updating voltage and power values of the converter station until the iteration requirements are met.

As an alternative embodiment, the power flow calculation of a voltage station uses an approximate calculation method to obtain an AC side active power according to a DC side active power; the AC side active power corresponding to the DC side active power $P_{dc0}$ of a node to be detected is assumed to be $P_{ac0}$, $P_{ac1}$ is taken as $mP_{dc0}$, and $P_{ac2}$ is taken as $nP_{dc0}$, where m is greater than 1 and n is less than 1; the corresponding DC side active power $P_{dc1}$ and $P_{dc2}$ are obtained from $P_{ac1}$ and $P_{ac2}$, $P_{ac3}$ is obtained according to the slope of the line connecting $P_{dc1}$ and $P_{dc2}$, and the corresponding DC side active power $P_{dc3}$ is obtained according to $P_{ac3}$; solving continues between $P_{ac1}$ and $P_{ac3}$ or $P_{ac3}$ and $P_{ac2}$ until the error with $P_{dc0}$ meets the set accuracy.

In the third aspect, the present disclosure provides a power flow calculation system for a flexible DC transmission system, including:

a unifying module, configured to, according to the flexible DC transmission system under different control strategies, construct a unified power flow model with a unified structure;

an initializing module, configured to determine a current main converter station, a current control strategy and an initial value and a limit value thereof, and form a power balance equation under the current control strategy according to the unified power flow model; and a power flow calculating module, configured to update the current DC node voltage according to the voltage variation obtained by solving the power balance equations, and, if the updated DC node voltage exceeds the limit value, switch the control strategy; and if the updated DC node voltage does not exceed the limit value and the iteration constraints are not satisfied, alternating the main converter station according to the priority until iteration is completed.

In the fourth aspect, the present disclosure provides an AC/DC hybrid power flow calculation system, including:

a DC power flow calculating module, configured to acquire a current main converter station, a current control strategy and an initial value and a limit value thereof of a flexible DC transmission system, and perform power flow calculation of the flexible DC transmission system by using the method in the first aspect;

a voltage station power flow calculating module, configured to, after the DC power flow iteration converges, perform power flow calculation of a voltage station, and for a converter station under DC voltage control or droop control, solve the active power and reactive power injected into an AC network by the converter station according to the active power injected into each DC node and a DC node voltage; and an AC power flow calculating module, configured to acquire power flow data of an AC system, and perform AC power flow calculation, and update voltage and power values of the converter station until the iteration requirements are met.

In the fifth aspect, the present disclosure provides an electronic device, including a memory and a processor and computer instructions stored on the memory and running on the processor, the computer instruction, when run by the processor, implementing the method in the first aspect and/or second aspect.

In the sixth aspect, the present disclosure provides a computer-readable storage medium, configured to store computer instructions, the computer instruction, when executed by a processor, implementing the method in the first aspect and/or second aspect.

Compared with the prior art, the beneficial effects of the present disclosure are as follows:

According to a power flow calculation method for a flexible DC transmission system proposed in the present disclosure, by introducing variables and taking different values for the two variables, various control strategies of converter stations are represented, so that a unified power flow model is formed. When the control strategy changes, only the values of the two variables are needed to change, without changing the dimension and structure of a Jacobian matrix. Under the unified power flow model, the power flow equations of a DC system has a fixed structure, which can be applied to power flow calculation under various control strategies. Therefore, the unified power flow model of the flexible DC transmission system can be used for calculating the power flow of a DC power grid with various control strategies conveniently and flexibly, and the control strategies can be simply and quickly switched.

According to the power flow calculation method for the flexible DC transmission system, the convergence of the power flow calculation of an AC/DC system is improved by inner-outer double-loop iteration in combination with the method of alternating main converter stations. In the process of power flow calculation, the main converter station acts as a balance node, and the node types of other converter stations are determined according to the control modes. When the main converter station cannot meet the control requirements, power flow calculation will be carried out with other converter stations as balance nodes in turn according to the balance node sequence given in advance. The problem of a power flow calculation error caused by unreasonable given data is solved.

In an AC/DC hybrid power grid power flow calculation method proposed in the present disclosure, an approximate calculation method is used when solving the power flow of a voltage station, which avoids the complicated calculation of a Jacobian matrix and simplifies the operation under the premise of ensuring the calculation accuracy, so that the power flow of a DC power grid with the hybrid control strategy and the power flow when the control strategy is switched based on the actual situation can be calculated conveniently and flexibly.

The advantages of the additional aspects of the present disclosure will be partially provided in the description below, some of which will become apparent from the description below, or will be understood by the practice of the present disclosure.

BRIEF DESCRIPTION OF THE DRAWINGS

The accompanying drawings constituting a part of the present disclosure are used to provide a further understanding of the present disclosure. The exemplary embodiments of the present disclosure and descriptions thereof are used to explain the present disclosure, and do not constitute an improper limitation to the present disclosure.

DETAILED DESCRIPTION

Figure 1:
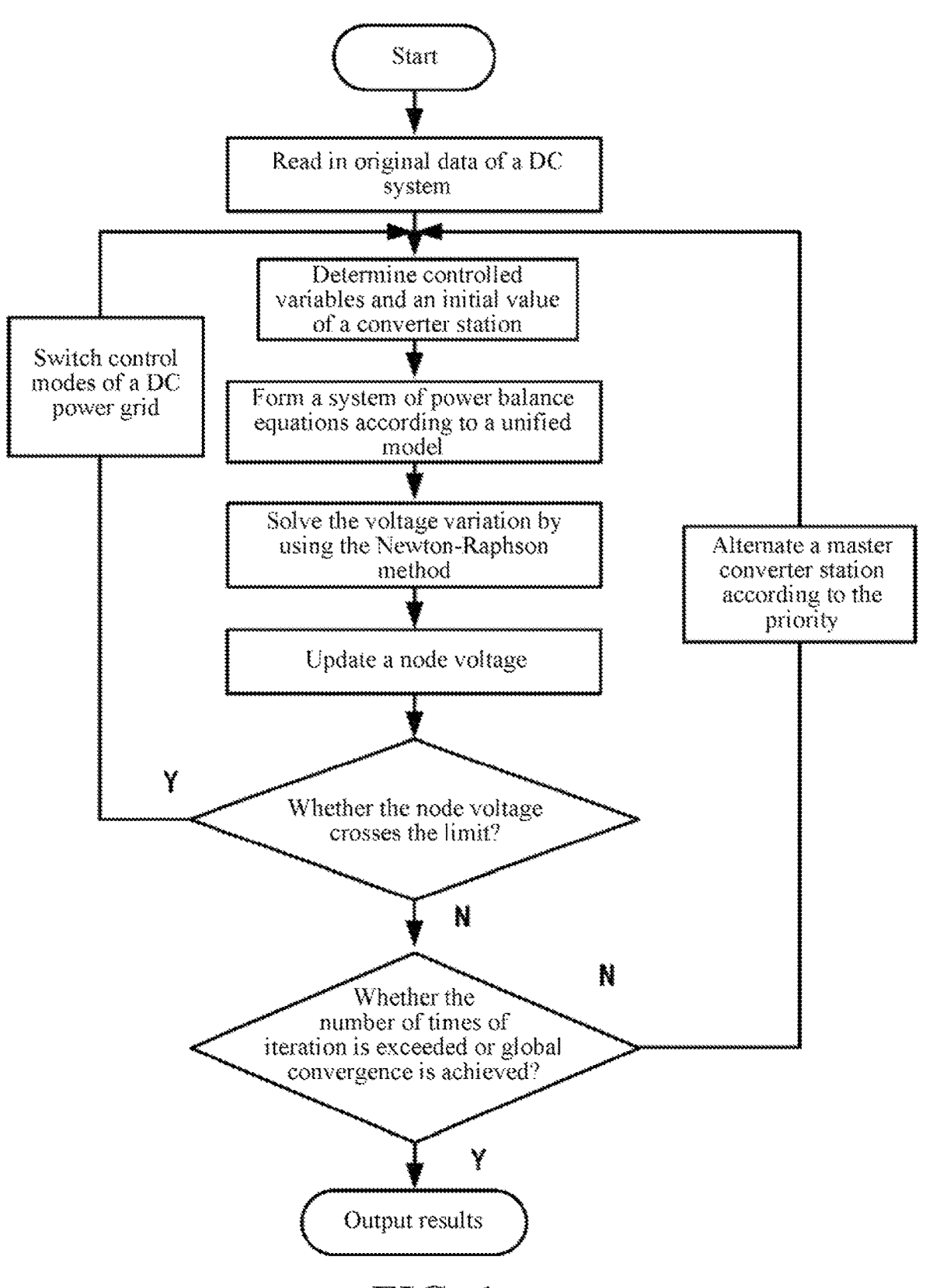
FIG. 1 is a flow chart of a power flow calculation method for a flexible DC transmission system provided by Embodiment 1 of the present disclosure.

The present disclosure is further described below with reference to the accompanying drawings and the embodiments.

It should be noted that the detailed descriptions below are all exemplary, and are intended to provide further descriptions of the present disclosure. Unless otherwise specified, all technical and scientific terms used herein have the same meanings as those usually understood by a person of ordinary skill in the art to which the present disclosure belongs.

It should be noted that the terms used herein are merely used for describing specific implementations, and are not intended to limit exemplary implementations of the present disclosure. As used herein, singular forms are intended to include plural forms as well, unless the context clearly indicates otherwise. In addition, it should be further understood that terms "include" and "have" and any other variants thereof are intended to cover a non-exclusive inclusion. For example, a process, method, system, product, or device that includes a list of steps or units is not necessarily limited to those steps or units that are clearly listed, but may include other steps or units not expressly listed or inherent to such a process, method, system, product, or device.

The embodiments in the present disclosure and features in the embodiments may be mutually combined in a case that no conflict occurs.

Embodiment 1

The present embodiment provides a power flow calculation method for a flexible DC transmission system, including:

according to the flexible DC transmission system under different control strategies, constructing a unified power flow model with a unified structure;

determining a current main converter station, a current control strategy and an initial value and a limit value thereof, and forming a power balance equation under the current control strategy according to the unified power flow model;

updating the current DC node voltage according to the voltage variation obtained by solving the power balance equations, and, if the updated DC node voltage exceeds the limit value, switching the control strategy; and if the updated DC node voltage does not exceed the limit value and the iteration constraints are not satisfied, alternating the main converter station according to the priority until iteration is completed.

In the present embodiment, the control strategies include a master-slave control strategy, a voltage deviation control strategy, an active power-voltage droop control strategy, and a current-voltage droop control strategy.

Specifically:

(1) the master-slave control strategy includes: with regard to a DC network having n DC nodes, a converter station connected to the No. 1 DC node is assumed as a main converter station, and the remaining converter stations are slave converter stations or DC points of common coupling; then, except that the converter station where the No. 1 DC node is located does not have a power balance equation, the rest of the DC nodes will have the power balance equations, so the model equations under the master-slave control strategy are:

$$\Delta P_i = (P_{dci} + P_{Gi} - P_{Li}) - U_i \sum_{j=1}^{n} U_j G_{ij} \quad (i = 2, 3, \ldots n)$$

where $\Delta P_i$ is the imbalance power of a DC node i, $P_{dci}$ is the injection power from the converter station to the DC node i, $P_{Gi}$ is the active power emitted by a power supply at the DC node i, $P_{Li}$ is the active power absorbed by a load at the DC node i, $U_i$ and $U_j$ are the voltage of the DC node i and the voltage of a DC node j respectively, and $G_{ij}$ is the admittance between the DC node i and the DC node j.

(2) The voltage deviation control strategy includes: with regard to a DC network having n DC nodes, it is assumed that a converter station connected to the No. 1 DC node is as a main converter station, a converter station connected to the No. 2 DC node is as a back-up main converter station, and the remaining converter stations are slave converter stations or DC points of common coupling; before converting the control mode, the converter station connected to the No. 1 DC node does not have a power balance equation; after converting the control mode, the converter station connected to the No. 2 DC node does not have a power balance equation, so the model equations under the voltage deviation control strategy are:

$$\begin{cases} \Delta P_i = (P_{dci} + P_{Gi} - P_{Li}) - U_i \sum_{j=1}^{n} U_j G_{ij} & \begin{array}{l}(i = 1, U_{dc2} \leq U_{dc2min} \text{ or} \\ U_{dc2} \geq U_{dc2max})\end{array} \\ \Delta P_i = (P_{dci} + P_{Gi} - P_{Li}) - U_i \sum_{j=1}^{n} U_j G_{ij} & \begin{array}{l}(i = 2, U_{dc2min} < \\ U_{dc2} < U_{dc2max})\end{array} \\ \Delta P_i = (P_{dci} + P_{Gi} - P_{Li}) - U_i \sum_{j=1}^{n} U_j G_{ij} & (i = 3, \ldots n) \end{cases}$$

where $U_{dc2}$ is the DC voltage of the No. 2 DC node, $U_{dc2min}$ is the minimum value of the DC voltage of the No. 2 DC node, and $U_{dc2max}$ is the maximum value of the DC voltage of the No. 2 DC node.

(3) The active power-voltage droop control equation of a DC system is:

$$P_{dci} = P_{dcrefi} - \frac{U_{dci} - U_{dcrefi}}{k_{dpi}}$$

where $P_{dcrefi}$ is the active power reference value of a DC node i, $U_{dci}$ is the DC voltage of the DC node i, $U_{dcrefi}$ is the DC voltage reference value of the DC node i, and $k_{dpi}$ is a droop coefficient under the active-voltage droop control mode.

The current-voltage droop control equation of the DC system is:

$$I_{dci} = I_{dcrefi} - \frac{U_{dci} - U_{dcrefi}}{k_{di}}$$

where $I_{dci}$ is the direct current of the DC node i, $I_{dcrefi}$ is the direct current reference value of the DC node i, and $k_{di}$ is a droop coefficient under the current-voltage droop control mode.

With regard to a DC network having n DC nodes, it is assumed that converter stations connected to the No. 1-m DC nodes use active power-voltage droop control, and converter stations connected to the No. (m+1)-n DC nodes use active power control or DC points of common coupling; then, each DC node has a power imbalance equation, and the model equations obtained under the active power-voltage droop control strategy are:

$$\Delta P_i = \left(P_{dcrefi} - \frac{U_{dci} - U_{dcrefi}}{k_{dpi}} + P_{Gi} - P_{Li}\right) - U_{dci}\sum_{j=1}^{n} U_{dcj}G_{ij}$$

$$(i = 1, 2, \dots, m)$$

$$\Delta P_i = (P_{dci} + P_{Gi} - P_{Li}) - U_{dci}\sum_{j=1}^{n} U_{dcj}G_{ij}$$

$$(i = m + 1, m + 2, \dots n)$$

Similarly, with regard to a DC network having n DC nodes, assuming that converter stations connected to the No. 1-m DC nodes use current-voltage droop control, and converter stations connected to the No. (m+1)-n DC nodes use active power control or DC points of common coupling; then, each DC node has a power imbalance equation, and the model equations obtained under the current-voltage droop control strategy are:

$$\Delta P_i = \left(U_{dci}\left(I_{dcrefi} - \frac{U_{dci} - U_{dcrefi}}{k_{di}}\right) + P_{Gi} - P_{Li}\right) - U_{dci}\sum_{j=1}^{n} U_{dcj}G_{ij}$$

$$(i = 1, 2, \dots, m)$$

-continued $$\Delta P_i = (P_{dci} + P_{Gi} - P_{Li}) - U_{dci}\sum_{j=1}^{n} U_{dcj}G_{ij}$$

$$(i = m + 1, m + 2, \dots n)$$

where $U_{dcj}$ is the DC voltage of a DC node j.

In the present embodiment, according to the combination of active power type variables and reactive power type variables of the converter station, the control strategy of the converter station has 10 feasible control modes, and the converter stations can be divided into power stations and voltage stations according to the type.

From the perspective of the flexible DC transmission system, the DC nodes are equivalent to in three types: P nodes with a determined power, U nodes with a given voltage, and droop nodes where the voltage and power or the current and voltage satisfy a functional relationship; where the U node is the DC node with a given voltage value, and the function thereof is equivalent to a balance node of an AC power grid; the P node is the DC node with a given active power value; the droop node is the DC node where the voltage and power or the current and voltage satisfying the functional relationship.

For a DC power grid, the voltage value of at least one DC node is given to maintain the voltage level of the DC power grid; when the P node is used for solving the power flow of the DC power grid, the power of a DC side needs to be calculated from the power of an AC side, which is called the power station; and after the DC power flow calculation is finished, the U node and the droop node need to calculate the power of an AC side from the power of a DC side, which is called the voltage station.

For the equivalent node type on an AC bus side, a bus with an active power and AC voltage is called a "PV node", and a bus with an active power and reactive power is called a "PQ node".

The ten feasible control modes are as shown in Table 1, where $\delta_s$ is the voltage phase angle of an AC bus of the converter station, $P_s$ is the active power of the AC bus of the converter station, $Q_s$ is the reactive power of the AC bus of the converter station, $U_s$ is the voltage amplitude of the AC bus of the converter station, $U_{dc}$ is a DC voltage, $I_{dc}$ is a direct current, and $P_{dc}$ is the active power injected into the DC power grid by the converter station.

TABLE 1

| | | | Ten feasible control modes | | |
|---|---|---|---|---|---|
| Manner | Active power control | Reactive power control | Equivalent node type on an AC bus side | Equivalent node type on a DC bus side | Classification |
| 1 | Constant $P_s$ | Constant $Q_s$ | PQ node | P node | Power station |
| 2 | Constant $P_s$ | Constant $U_s$ | PV node | P node | |
| 3 | Constant $\delta_s$ | Constant $Q_s$ | PQ node | P node | |
| 4 | Constant $\delta_s$ | Constant $U_s$ | PV node | P node | |
| 5 | Constant $U_{dc}$ | Constant $Q_s$ | PQ node | U node | Voltage |
| 6 | Constant $U_{dc}$ | Constant $U_s$ | PV node | U node | station |
| 7 | $I_{dc}$-$U_{dc}$ droop | Constant $Q_s$ | PQ node | Droop node | |
| 8 | $I_{dc}$-$U_{dc}$ droop | Constant $U_s$ | PV node | Droop node | |
| 9 | $P_{dc}$-$U_{dc}$ droop | Constant $Q_s$ | PQ node | Droop node | |
| 10 | $P_{dc}$-$U_{dc}$ droop | Constant $U_s$ | PV node | Droop node | |

When the converter station is in the control modes of 1, 2, 3 and 4, the injection power of the DC node is calculated according to the simple power flow equation, and after the power flow calculation of the DC power grid is completed, the active power and reactive power of the AC node of the voltage station are solved according to the voltage and active power of each node of the DC power grid.

The present embodiment determines an initial value for the power station, as shown in Table 2; where $P_s^*$ is an initial given active power of the converter station, $Q_s^*$ is an initial given reactive power of the converter station, $U_s^*$ is an initial AC bus voltage amplitude of the converter station and $\delta_s^*$ is an initial AC bus voltage phase angle of the converter station.

TABLE 2

Initial values of various types of converter stations

| Manner | $P_s$ | $Q_s$ | $U_s$ | $\delta_s$ |
|---|---|---|---|---|
| 1 | $P_s^*$ | $Q_s^*$ | 1.0 | 0 |
| 2 | $P_s^*$ | 0 | $U_s^*$ | 0 |
| 3 | 0 | $Q_s^*$ | 1.0 | $\delta_s^*$ |
| 4 | 0 | 0 | $U_s^*$ | $\delta_s^*$ |

In the present embodiment, according to various control strategies, the power balance equations and Jacobian matrix of a single control strategy are analyzed one by one, and then the power balance equations containing all the control strategies and the Jacobian matrix are derived, and the unified power flow model with the unified structure is obtained by introducing variables. Specifically:

the present embodiment introduces two variables $\alpha$ and $\beta$, and by changing the values of $\alpha$ and $\beta$, the unified power flow model can represent different control strategies of the converter station, so that the model is unified; when changing the control strategy of the converter station, only the values of the two variables need to be modified, and the Jacobian matrix structure thereof does not need to be changed.

For all the DC nodes, the following power balance equation is constructed:

$$\Delta P_i = \left( P_{dci} + \alpha \cdot U_{dci} \left( I_{dcrefi} - \frac{U_{dci} - U_{dcrefi}}{k_{di}} \right) - \beta \frac{U_{dci} - U_{dcrefi}}{k_{dpi}} + P_{Gi} - P_{Li} \right) - U_{dci} \sum_{j=1}^{n} U_{dcj} G_{ij}$$

$$(i = 1, 2, \dots, n)$$

when the converter station at the DC node operates under an active power control strategy, $\alpha=0$, $\beta=0$, a set power value $P_{set}$ is taken as $P_{dci}$, and $I_{dcrefi}$ and $U_{dcrefi}$ can be arbitrary values at this moment;

when the converter station at the DC node operates under the active power-voltage droop control strategy, $\alpha=0$, $\beta=1$, $P_{dci}$=an active power reference point $P_{dcref}$, $U_{dcrefi}$=a DC voltage reference point $U_{dcref}$, and $I_{dcrefi}$ can be an arbitrary value at this moment;

when the converter station at the DC node operates under the current-voltage droop control strategy, $\alpha=1$, $\beta=0$, $P_{dci}$=0, and $U_{dcrefi}$=$U_{dcref}$ at this moment;

when there is no converter station at the DC node or the converter station stops operating, $\alpha=0$, $\beta=0$, and $P_{dci}$=0 at this moment;

when the converter station at the DC node operates under a DC voltage control strategy, the DC node does not have a power balance equation.

Thus, a modified equation and values for each element thereof are obtained.

$$\begin{bmatrix} \Delta P_1 \\ \Delta P_2 \\ \Delta P_1 \\ \Delta P_3 \\ \dots \\ \Delta P_{n-1} \end{bmatrix} = \begin{bmatrix} \frac{\partial \Delta P_1}{\partial U_{dc1}} & \frac{\partial \Delta P_1}{\partial U_{dc2}} & \dots & \frac{\partial \Delta P_1}{\partial U_{dcn-1}} \\ \frac{\partial \Delta P_2}{\partial U_{dc1}} & \frac{\partial \Delta P_2}{\partial U_{dc2}} & \dots & \frac{\partial \Delta P_2}{\partial U_{dcn-1}} \\ \vdots & & \ddots & \vdots \\ \frac{\partial \Delta P_{n-1}}{\partial U_{dc1}} & \frac{\partial \Delta P_{n-1}}{\partial U_{dc2}} & \dots & \frac{\partial \Delta P_{n-1}}{\partial U_{dcn-1}} \end{bmatrix} \begin{bmatrix} \Delta U_{dc1} \\ \Delta U_{dc2} \\ \Delta U_{dc3} \\ \Delta U_{dc4} \\ \dots \\ \Delta U_{dcn-1} \end{bmatrix}$$

$$\frac{\partial \Delta P_i}{\partial U_{dci}} = \begin{cases} -U_{dci} G_{ij}, & i \neq j \\ \alpha * I_{dcrefi} - \alpha * \frac{U_{dci} - U_{dcrefi}}{k_{di}} - \alpha * \frac{U_{dci}}{k_{di}} - \\ \quad \beta * \frac{1}{k_{dpi}} - 2 G_{ii} U_{dci} - \sum_{\substack{k=1 \\ k \neq i}}^{n} G_{ik} U_{dck} & , \quad i = j \end{cases}$$

In the present embodiment, since the initial value deviates from the result by a large amount, the numerical value of the power flow calculation deviates from the real value by a large amount, a calculation method of inner-outer double-loop iteration is used, as shown in FIG. 1, which specifically includes.

(1) Acquiring original data of the flexible DC transmission system, including a main converter station, a control strategy of the main converter station, and an initial value and a limit value under the control strategy; there are ten types of converter stations. In one flexible DC transmission system, the initial values of different types of converter stations are different. According to the unified power flow model, a system of power balance equations is formed.

(2) Solving the DC voltage variation by using a Newton-Raphson method and updating a DC node voltage.

A DC network does not contain a reactance, and is a pure resistance linear network; it is assumed that the DC network contains n DC nodes in total, the relationship between the DC node voltage and the DC node current of the DC network is expressed as:

$$I_d = G_{dc} U_d$$

In the formula, $I_d$ is a direct current, $U_d$ is a DC voltage, and $G_{dc}$ is the conductance matrix of the DC power grid.

It can also be written as:

$$I_i = \sum_{j \in i} G_{ij} U_j \ (i = 1, 2, \dots n)$$

the injection active power $P_i$ of the $i_{th}$ DC node is:

$$P_i = P_{dci} + P_{Gi} - P_{Li}$$

In the formula, $P_{dci}$ is the injection active power of the converter station of the DC node i, $P_{Gi}$ is the active power emitted by a power supply at the DC node i, and $P_{Li}$ is the active power absorbed by a load at the DC node i.

The relationship between the injection current $I_i$ and the injection active power $P_i$ and the voltage $U_i$ of the DC node i is:

$$P_i = U_i I_i$$

The power balance equation of the $i_{th}$ DC node is:

$$P_{dci} + P_{Gi} - P_{Li} = U_i \sum_{j \in i} U_j G_{ij} \quad (i = 1, 2, \ldots n)$$

the injection active power and voltage of the DC node i satisfy the constraints of the active power and voltage, namely:

$$\begin{cases} P_i \le P_{maxi} \\ U_{mini} \le U_i \le U_{maxi} \end{cases}$$

In the formula, $P_{maxi}$ is the active power maximum value of the DC node i, $U_{maxi}$ is the voltage maximum value of the DC node i, and $U_{mini}$ is the voltage minimum value of the DC node i.

(3) Judging whether the DC node voltage crosses the limit so as to judge whether the DC power grid crosses the limit. In addition, whether the active power of the DC node exceeds the limit value is judged; where, the DC node voltage has an upper limit value and a lower limit value, the active power also has an upper limit value and a lower limit value of injection and outflow, and the limit of the active power comes from the limit of the converter station on the active power.

Specifically, if the DC node voltage crosses the limit, since the resistance of a DC network line is small and the DC voltage is basically consistent, the DC voltage of all the converter stations is modified; if the active power of the DC node crosses the limit during voltage deviation control of the DC node, the back-up converter station needs to be put into operation at this moment; if the active power of the converter station crosses the limit during droop control, the active power of the converter station crossing the limit and the active power of the converter station without crossing the limit needs to be re-modified; global iteration is restarted after modifying is performed according to different types under which the limit is crossed.

(4) If the limit is not crossed and the outer loop iteration constraints are not satisfied (the number of iterations is not exceeded or the global convergence is not reached), alternating the main converter station according to the priority.

During the iterative calculation, the power of the converter station or the voltage of the DC node will cross the limit, but the actual power flow calculation result will not cross the limit. Therefore each converter station is alternately used as a balance converter station and the priority of each converter station as the balance converter station is ranked. When the converter station with the priority of 1 cannot satisfy the constraint limit of the power flow calculation, the converter station with the priority of 2 is converted as the balance converter station, and the rest can be done in the same manner.

At the $n_{th}$ inner-loop iteration, when the converter station with the priority of 1 cannot satisfy the constraints of the outer-loop iteration in the DC power flow calculation, alternation is performed. However, in the $(n+1)_{th}$ global iteration, the DC power flow calculation starts from the converter station with the priority of 1 alternately, thus avoiding errors in power flow calculation caused by unreasonable given data.

Embodiment 2

The present embodiment provides an AC/DC hybrid power flow calculation method for a flexible DC transmission system, including:

acquiring a current main converter station, a current control strategy and an initial value and a limit value thereof of the flexible DC transmission system, and performing power flow calculation of the flexible DC transmission system by using the method of Embodiment 1 after the DC power flow iteration converges, performing power flow calculation of a voltage station, and for converter stations under DC voltage control or droop control, solving the active power and reactive power injected into an AC network by the converter station according to the active power injected into each DC node and a DC node voltage; and acquiring power flow data of an AC system, and performing AC power flow calculation, and updating voltage and power values of the converter station until the iteration requirements are met.

Figure 2:
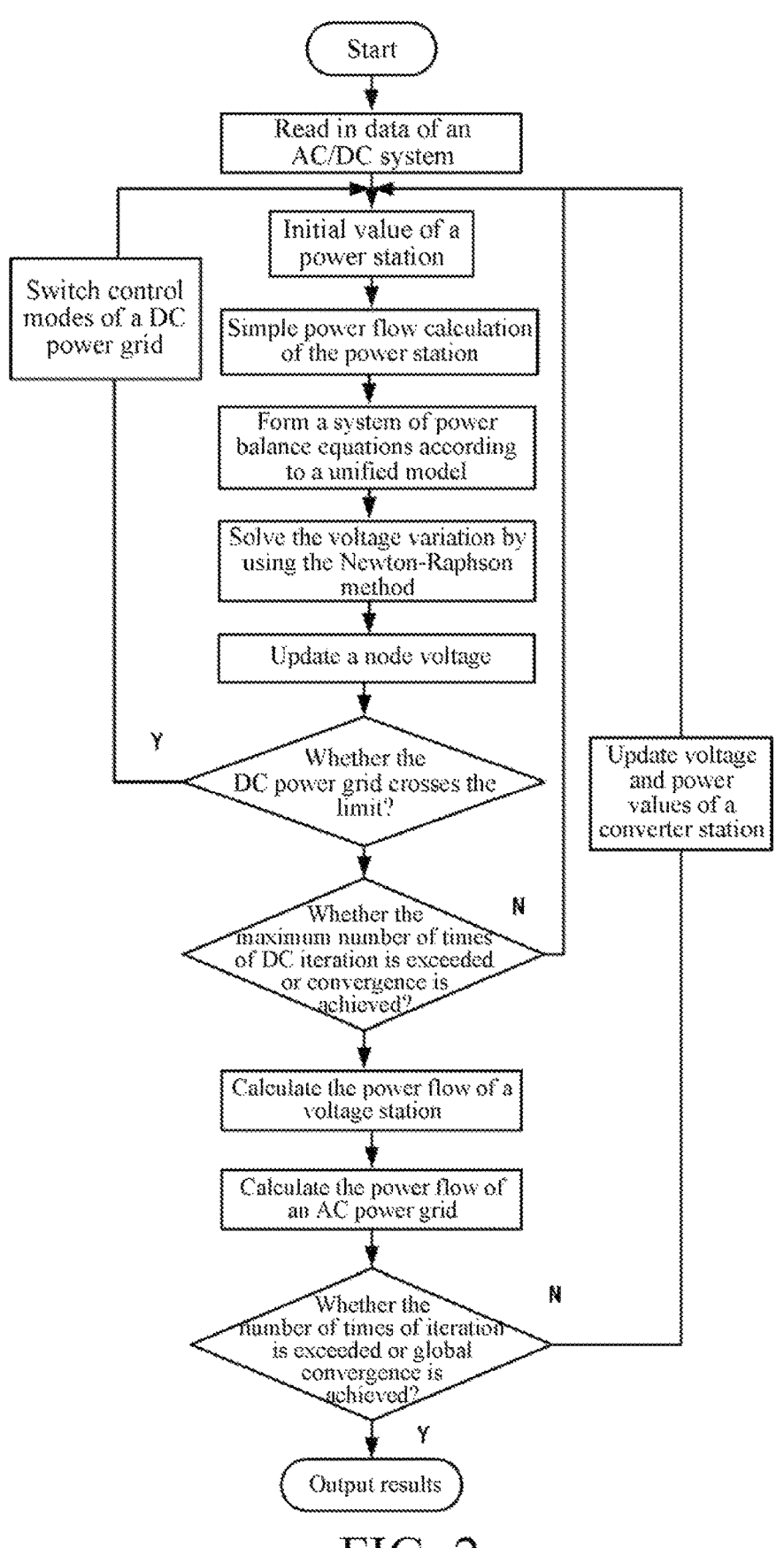
FIG. 2 is a flow chart of an AC/DC hybrid power gird power flow calculation method provided by Embodiment 2 of the present disclosure.

Specifically, as shown in FIG. 2:

(1) Reading data of an AC/DC system; determining the initial value of a power station according to the type of the converter station and performing simple power flow calculation for the power station.

Specifically, the converter stations are divided into the power stations and a voltage stations and the initial value of the power stations is determined first. The AC system influences a DC system through a bus voltage phase $\dot{U}_s$ on an AC power grid side to which the converter station is connected, and if the AC voltage is known, the power flow of a DC power grid is solved independently. In the present embodiment, simple power flow calculation is performed when the converter station is in control modes of 1, 2, 3 and 4:

$$\begin{cases} \dot{U}_f = \dot{U}_s + \dfrac{Z_{tf} \cdot (P_s - jQ_s)}{\dot{U}_s^*} \\ \dot{I}_c = \dfrac{(P_s - jQ_s)}{\dot{U}_s^*} + \dfrac{\dot{U}_f}{Z_f} \\ \dot{U}_c = \dot{U}_f + Z_c \dot{I}_c \\ P_c = Re(\dot{U}_c \dot{I}_c^*) \\ P_{c,loss} = a|\dot{I}_c|^2 + b|\dot{I}_c| + c \\ P_{dc} = -P_c - P_{c,loss} \end{cases}$$

where $Z_{tf}$ is the impedance of a converter transformer, $\dot{U}_f$ is the phase of a voltage at a filter node, $Z_f$ is the impedance value of a filter, $Q_f$ is the reactive power of the filter, $Z_c$ is the impedance value of a phase reactor, $\dot{I}_c$ is the phase of a current flowing from a converter station bus to the filter node, $\dot{U}_c$ is the phase of a bus voltage on the converter side, $P_c$ and $Q_c$ are the active power and reactive power on the converter station side respectively, $P_{c,loss}$ is the loss of a converter, $\dot{U}_s^*$ is the conjugate of $\dot{U}_s$, $\dot{I}_c^*$ is the conjugate of $\dot{I}_c$, and a, b, c are the coefficients of an active loss model of the converter station.

(2) Acquiring a current main converter station, a current control strategy and an initial value and a limit value thereof of the flexible DC transmission system, and performing power flow calculation of the flexible DC transmission system by using the method of Embodiment 1.

(3) After the DC power flow iteration converges or exceeds the maximum number of times of DC iteration, performing power flow calculation of the voltage station, the power flow calculation of the voltage station being, for converter stations under DC voltage control or droop control, to solve the active power and reactive power injected into an AC network by the converter station from the active power injected into each DC node of a DC power grid and a DC node voltage at this moment after the power flow of the DC power grid converges each time, In the present embodiment, for the power flow calculation of the voltage station, a system of non-linear equations is constructed:

$$\begin{cases} P_{dc} + P_c(X) + P_{c,loss}(X) = 0 \\ P_{cf}(X) - P_{fs}(X) = 0 \\ Q_s - Q_s(X) = 0 \\ Q_{cf}(X) - Q_{fs}(X) + Q_f(X) = 0 \end{cases}$$

where $P_{cf}$ is the active power obtained after passing through the commutation reactance, $P_{fs}$ is the active power obtained after passing through the filter node and $Q_s(X)$ is the reactive power calculated by the converter transformer; $Q_{cf}$ is the reactive power obtained after passing through the commutation reactance, $Q_{fs}$ is the reactive power obtained after passing through the filter node and $Q_f$ is the reactive power provided by the filter.

Four non-linear equations need to be constructed for each converter station for iterative calculation, and the calculation process is too complicated when using python to solve the Jacobian matrix. Therefore, the present embodiment proposes an approximate calculation method, where the AC side active power $P_{ac}$ can be solved from DC side active power $P_{dc}$; the AC side active power corresponding to the DC side active power $P_{dc0}$ of a node to be detected is assumed to be $P_{ac0}$, $P_{ac1}$ is taken as $mP_{dc0}$, and $P_{ac2}$ is taken as $nP_{dc0}$, where m is greater than 1 and n is less than 1; the corresponding DC side active power $P_{dc1}$ and $P_{dc2}$ are obtained from $P_{ac1}$ and $P_{ac2}$, $P_{ac3}$ is obtained according to the slope of the line connecting $P_{dc1}$ and $P_{dc2}$, and $P_{dc3}$ is obtained according to $P_{ac3}$; solving continues between $P_{ac1}$ and $P_{ac3}$ or $P_{ac3}$ and $P_{ac2}$ until the error with $P_{dc0}$ meets the set accuracy.

Figure 3:
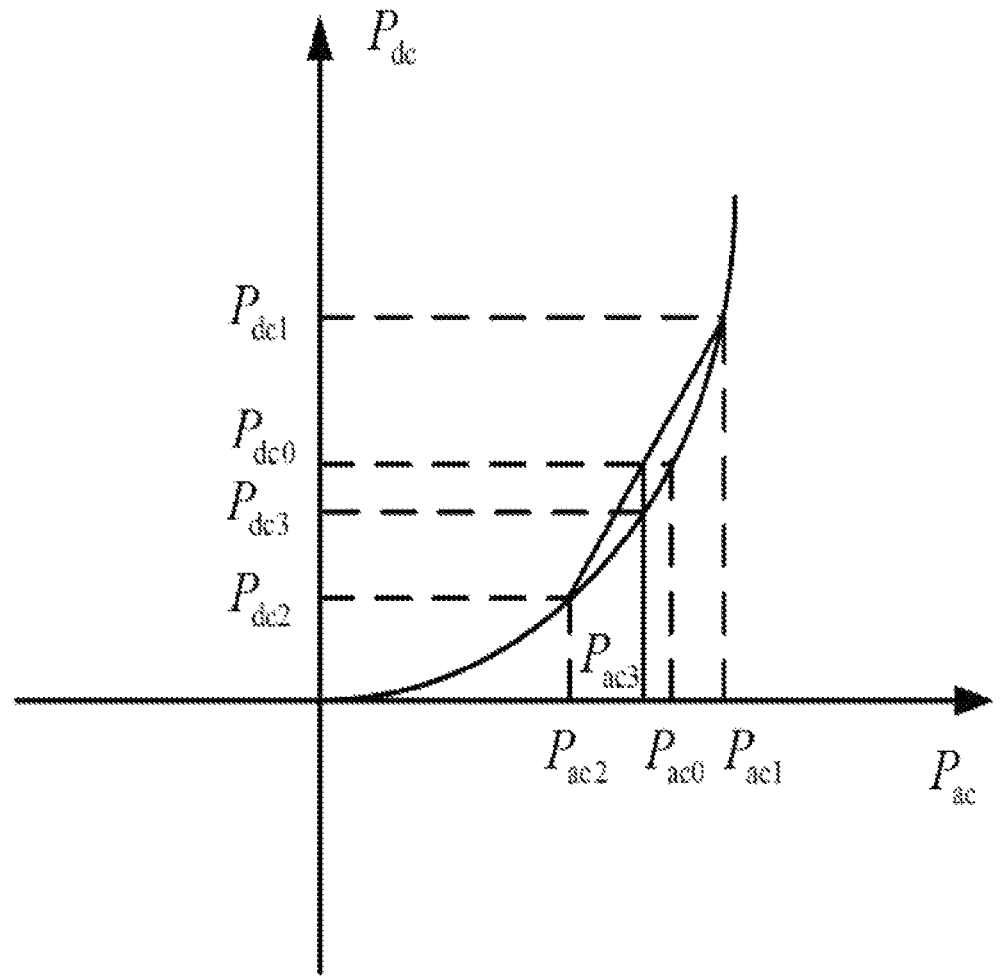
FIG. 3 is a schematic diagram of using an approximate calculation algorithm for power flow calculation of a voltage station provided in Embodiment 2 of the present disclosure.

As shown in FIG. 3, the value of the real $P_{ac}$ corresponding to $P_{dc0}$ is assumed as $P_{ac0}$, $P_{ac1}$ is taken as $1.05 P_{dc0}$, $P_{ac2}$ is taken as $0.95 P_{dc0}$, and $P_{dc1}$ and $P_{dc2}$ are solved from $P_{ac1}$ and $P_{ac2}$; $P_{ac3}$ is solved from the slope of these two points, and $P_{dc3}$ is solved from $P_{ac3}$, solving between $P_{ac1}$ and $P_{ac3}$ continues until the error between $P_{dc}$ and $P_{dc0}$ meets the set accuracy. The use of the approximate calculation method can obtain the power flow result of the voltage station without requiring complex Jacobian matrix on the premise that the accuracy is guaranteed.

(4) Acquiring power flow data of the AC system, the power flow data of the AC system including power flow data of buses, transformers, AC lines and generators; performing power flow calculation of an AC power grid, and updating voltage and power values of the converter station; after power flow calculation of the AC power grid ends, updating the voltage amplitude and phase angle of the bus connected to the converter station.

Specifically, the voltage and power of the converter station are updated after the AC power flow calculation is completed. An alternating AC/DC power flow iteration algorithm solves the AC system and the DC system respectively, with the AC system and the DC system acting as boundary conditions for each other during each iteration. The AC system influences the DC system through the voltage phase $\dot{U}_s$ of the AC bus connected to the converter station, and if the AC voltage is known, the power flow of the DC power grid can be solved independently. The DC system influences the AC system through the injection power of the AC bus connected to the converter station, and if the power is known, the power flow of the AC power grid can be solved independently.

When the global iteration meets the error requirements, the iterations are terminated, the power flow calculation is completed and the power flow calculation results are output. If converge is still not achieved when the maximum number of times of global iteration is reached, the iteration is exited and the result is output.

Embodiment 3

The present embodiment provides a power flow calculation system for a flexible DC transmission system, including:

a unifying module, configured to, according to the flexible DC transmission system under different control strategies, construct a unified power flow model with a unified structure;

an initializing module, configured to determine a current main converter station, a current control strategy and an initial value and a limit value thereof, and form the power balance equations under the current control strategy according to the unified power flow model; and a power flow calculating module, configured to update the current DC node voltage according to the voltage variation obtained by solving the power balance equations, and, if the updated DC node voltage exceeds the limit value, switch the control strategy; and if the updated DC node voltage does not exceed the limit value and the iteration constraints are not satisfied, alternate the main converter station according to the priority until iteration is completed.

Embodiment 4

The present embodiment provides an AC/DC hybrid power flow calculation system, including:

a DC power flow calculating module, configured to acquire a current main converter station, a current control strategy and an initial value and a limit value thereof of a flexible DC transmission system, and perform power flow calculation of the flexible DC transmission system by using the method of Embodiment 1;

a voltage station power flow calculating module, configured to, after the DC power flow iteration converges, perform power flow calculation of a voltage station, and for a converter station under DC voltage control or droop control, solve the active power and reactive power injected into an AC network by the converter station according to the active power injected into each DC node and a DC node voltage; and an AC power flow calculating module, configured to acquire power flow data of an AC system, and perform AC power flow calculation, and update voltage and power values of the converter station until the iteration requirements are met.

It should be noted herein that, the above modules correspond to the steps described in Embodiments 1 and 2, the above-mentioned modules are the same as the examples and application scenarios realized by the corresponding steps, but are not limited to the content disclosed in the above-mentioned embodiments. It should be noted that, the above-mentioned modules may be executed, as part of a system, in a computer system such as a set of computer-executable instructions.

In more embodiments, further provided is an electronic device, including a memory and a processor and computer instructions stored on the memory and running on the processor, the computer instruction, when run by the processor, implement the method described in Embodiment 1 and/or Embodiment 2. For the sake of brevity, this will not be repeated here.

It should be understood that in the present embodiment, the processor may be a central processing unit (CPU), the processor may also be other general purpose processors, digital signal processors (DSP), application specific integrated circuits (ASIC), field programmable gate arrays (FPGA) or other programmable logic devices, discrete gates or transistor logic devices, discrete hardware components, etc. The general purpose processor may be a microprocessor or the processor may also be any conventional processor, etc.

The memory may include a read-only memory and a random access memory and provide instructions and data to the processor, and a portion of the memory may also include a non-volatile random memory. For example, the memory may also store information about the type of the device.

A computer-readable storage medium is configured to store computer instructions, the computer instruction, when executed by a processor, implement the method described in Embodiment 1 and/or Embodiment 2.

The method in the embodiment can be directly implemented and completed by a hardware processor, or implemented and completed by a combination of hardware and software modules in the processor. The software module can be located in a random memory, a flash memory, a read-only memory, a programmable read-only memory or an electrically erasable programmable memory, a register and other storage media well established in the art. The storage medium is located in the memory, the processor reads information in the memory, and the steps of the above-mentioned method are completed in combination with the hardware thereof. To avoid repetition, this will not be described in detail here.

A person of ordinary skill in the art may notice that the exemplary units and algorithm steps described with reference to the present embodiment can be implemented in electronic hardware, or a combination of computer software and electronic hardware. Whether the functions are executed in a manner of hardware or software depends on particular applications and design constraint conditions of the technical calculations. A person skilled in the art may use different methods to implement the described functions for each particular application, but it should not be considered that the implementation goes beyond the scope of this application.

The specific implementations of the present disclosure are described above with reference to the accompanying drawings, but are not intended to limit the protection scope of the present disclosure. A person skilled in the art should understand that various modifications or deformations may be made without creative efforts based on the technical calculations of the present disclosure, and such modifications or deformations shall fall within the protection scope of the present disclosure.

What is claimed is:

1. A power flow calculation method for a flexible direct current (DC) transmission system, comprising:

according to the flexible DC transmission system under different control strategies, constructing a unified power flow model with a unified structure;

determining a current main converter station, a current control strategy and an initial value and a limit value thereof, and forming a power balance equation under the current control strategy according to the unified power flow model;

the power balance equation in the unified power flow model is:

$$\Delta P_i =$$

$$\left( P_{dci} + \alpha \cdot U_{dci} \left( I_{dcrefi} - \frac{U_{dci} - U_{dcrefi}}{k_{di}} \right) - \beta \frac{U_{dci} - U_{dcrefi}}{k_{dpi}} + P_{Gi} - P_{Li} \right) -$$

$$U_{dci} \sum_{j=1}^{n} U_{dcj} G_{ij}$$

$$(i = 1, 2, \ldots, n);$$

wherein, $\Delta P_i$ is the imbalance power of a DC node i, $P_{dci}$ is the injection power from a converter station to the DC node i, $U_{dci}$ is the DC voltage of the DC node i, $P_{Gi}$ is the active power emitted by a power supply at the DC node i, $P_{Li}$ is the active power absorbed by a load at the DC node i, $G_{ij}$ is the admittance between the node i and a node j, $I_{dcrefi}$ is the direct current reference value of the DC node i, $k_{di}$ is a droop coefficient under the current-voltage droop control mode, $U_{dcrefi}$ is the DC voltage reference value of the DC node i, $k_{dpi}$ is a droop coefficient under the active power-voltage droop control mode, $U_{dcj}$ is the DC voltage of the DC node j, and n is the number of nodes; $\alpha$ and $\beta$ are adjustable variables;

updating the current DC node voltage according to the voltage variation obtained by solving the power balance equations, then judging whether the updated DC node voltage exceeds the limit value, so as to judge whether the flexible DC transmission system exceeds the limit, wherein:

if the updated DC node voltage exceeds the limit value modifying DC voltages of all the converter stations; then if the active power of the DC node exceeds the limit value during a voltage deviation control of the DC node, putting a back-up converter station into operation at this moment; and then if the active power of the converter station exceeds the limit value during a droop control, re-modifying the active power of the converter station exceeding the limit value and the active power of the converter station not exceeding the limit value;

and if the updated DC node voltage does not exceed the limit value and the iteration constraints are not satisfied, alternating the main converter station according to the priority until iteration is completed.

2. The power flow calculation method for the flexible DC transmission system according to claim 1, wherein the current control strategy comprises a master-slave control strategy, a voltage deviation control strategy, an active power-voltage droop control strategy, and a current-voltage droop control strategy.

3. The power flow calculation method for the flexible DC transmission system according to claim 1, wherein in the unified power flow model, by changing the values of the adjustable variables a and B, the unified power flow model represents different control strategies.

4. An AC/DC alternating current/direct current (AC/DC) hybrid power flow calculation method, comprising:

acquiring a current main converter station, a current control strategy and an initial value and a limit value thereof of a flexible DC transmission system;

according to the flexible DC transmission system under different control strategies, constructing a unified power flow model with a unified structure;

determining a current main converter station, a current control strategy and an initial value and a limit value thereof, and forming a power balance equation under the current control strategy according to the unified power flow model;

the power balance equation in the unified power flow model is:

$$\Delta P_i =$$

$$\left( P_{dci} + \alpha \cdot U_{dci} \left( I_{dcrefi} - \frac{U_{dci} - U_{dcrefi}}{k_{di}} \right) - \beta \frac{U_{dci} - U_{dcrefi}}{k_{dpi}} + P_{Gi} - P_{Li} \right) -$$

$$U_{dci} \sum_{j=1}^{n} U_{dcj} G_{ij}$$

$$(i = 1, 2, \ldots, n);$$

wherein, $\Delta P_i$ is the imbalance power of a DC node i, $P_{dci}$ is the injection power from a converter station to the DC node i, $U_{dci}$ is the DC voltage of the DC node i, $P_{Gi}$ is the active power emitted by a power supply at the DC node i, $P_{Li}$ is the active power absorbed by a load at the DC node i, $G_{ij}$ is the admittance between the node i and a node j, $I_{dcrefi}$ is the direct current reference value of the DC node i, $k_{di}$ is a droop coefficient under the current-voltage droop control mode, $U_{dcrefi}$ is the DC voltage reference value of the DC node i, $k_{dpi}$ is a droop coefficient under the active power-voltage droop control mode, $U_{dcj}$ is the DC voltage of the DC node j, and n is the number of nodes; $\alpha$ and $\beta$ are adjustable variables;

updating the current DC node voltage according to the voltage variation obtained by solving the power balance equations, and, if the updated DC node voltage exceeds the limit value, switching the control strategy; and if the updated DC node voltage does not exceed the limit value and the iteration constraints are not satisfied, alternating the main converter station according to the priority until iteration is completed;

after the DC power flow iteration converges, performing power flow calculation of a voltage station, and for a converter station under DC voltage control or droop control, solving the active power and reactive power injected into an AC network by the converter station according to the active power injected into each DC node and a DC node voltage;

acquiring power flow data of an AC system, wherein the power flow data of the AC system comprises power flow data of bus, transformers, AC lines and generators;

performing a power flow calculation of the AC system, and updating voltage and power values of the converter station until the iteration requirements are met; and after the power flow calculation of the AC system ends, updating a voltage amplitude and a phase angle of the bus connected to the converter station.

5. The AC/DC hybrid power flow calculation method according to claim 4, wherein the power flow calculation of a voltage station uses an approximate calculation method to obtain an AC side active power according to a DC side active power; the AC side active power corresponding to the DC side active power Paco of a node to be detected is assumed to be $P_{ac0}$, $P_{ac1}$ is taken as $mP_{dc0}$, and $P_{ac2}$ is taken as $nP_{dc0}$, where m is greater than 1 and n is less than 1; the corresponding DC side active power $P_{dc1}$ and $P_{dc2}$ are obtained from $P_{ac1}$ and $P_{ac2}$, $P_{ac3}$ is obtained according to the slope of the line connecting $P_{dc1}$ and $P_{dc2}$, and the corresponding DC side active power $P_{dc3}$ is obtained according to $P_{ac3}$; solving continues between $P_{ac1}$ and $P_{ac3}$ or $P_{ac3}$ and $P_{ac2}$ until the error with $P_{dc0}$ meets the set accuracy.

6. An electronic device, comprising a memory and a processor and computer instructions stored on the memory and running on the processor, the computer instruction, when run by the processor, implementing the method according to claim 4.

7. An electronic device, comprising a memory and a processor and computer instructions stored on the memory and running on the processor, the computer instruction, when run by the processor, implementing the method according to claim 1.

8. A non-transitory computer-readable storage medium, configured to store computer instructions, which, when executed by a processor, cause the processor to implement method steps comprising:

according to the flexible DC transmission system under different control strategies, constructing a unified power flow model with a unified structure;

determining a current main converter station, a current control strategy and an initial value and a limit value thereof, and forming a power balance equation under the current control strategy according to the unified power flow model;

the power balance equation in the unified power flow model is:

$$\Delta P_i =$$

$$\left( P_{dci} + \alpha \cdot U_{dci} \left( I_{dcrefi} - \frac{U_{dci} - U_{dcrefi}}{k_{di}} \right) - \beta \frac{U_{dci} - U_{dcrefi}}{k_{dpi}} + P_{Gi} - P_{Li} \right) -$$

$$U_{dci} \sum_{j=1}^{n} U_{dcj} G_{ij}$$

$$(i = 1, 2, \ldots, n);$$

wherein, $\Delta P_i$ is the imbalance power of a DC node i, $P_{dci}$ is the injection power from a converter station to the DC node i, $U_{dci}$ is the DC voltage of the DC node i, $P_{Gi}$ is the active power emitted by a power supply at the DC node i, $P_{Li}$ is the active power absorbed by a load at the DC node i, $G_{ij}$ is the admittance between the node i and a node j, $I_{dcrefi}$ is the direct current reference value of the DC node i, $k_{di}$ is a droop coefficient under the current-voltage droop control mode, $U_{dcrefi}$ is the DC voltage reference value of the DC node i, $k_{dpi}$ is a droop coefficient under the active power-voltage droop control mode, $U_{dcj}$ is the DC voltage of the DC node j, and n is the number of nodes; $\alpha$ and $\beta$ are adjustable variables;

updating the current DC node voltage according to the voltage variation obtained by solving the power balance equations, then judging whether the updated DC node voltage exceeds the limit value, so as to judge whether the flexible DC transmission system exceeds the limit, wherein:

if the updated DC node voltage exceeds the limit value, modifying DC voltages of all the converter stations; then if the active power of the DC node exceeds the limit value during a voltage deviation control of the DC node, putting a back-up converter station into operation at this moment; and then if the active power of the converter station exceeds the limit value during a droop control, re-modifying the active power of the converter station exceeding the limit value and the active power of the converter station not exceeding the limit value;

and if the updated DC node voltage does not exceed the limit value and the iteration constraints are not satisfied, alternating the main converter station according to the priority until iteration is completed.

9. A non-transitory computer-readable storage medium, configured to store computer instructions, when the computer instruction is executed by a processor, causing the processor to implement method steps comprising:

acquiring a current main converter station, a current control strategy and an initial value and a limit value thereof of a flexible DC transmission system;

according to the flexible DC transmission system under different control strategies, constructing a unified power flow model with a unified structure;

determining a current main converter station, a current control strategy and an initial value and a limit value thereof, and forming a power balance equation under the current control strategy according to the unified power flow model;

the power balance equation in the unified power flow model is:

$$\Delta P_i =$$

$$\left( P_{dci} + \alpha \cdot U_{dci} \left( I_{dcrefi} - \frac{U_{dci} - U_{dcrefi}}{k_{di}} \right) - \beta \frac{U_{dci} - U_{dcrefi}}{k_{dpi}} + P_{Gi} - P_{Li} \right) -$$

$$U_{dci} \sum_{j=1}^{n} U_{dcj} G_{ij}$$

$$(i = 1, 2, \dots, n);$$

wherein, $\Delta P_i$ is the imbalance power of a DC node i, $P_{dci}$ is the injection power from a converter station to the DC node i, $U_{dci}$ is the DC voltage of the DC node i, $P_{Gi}$ is the active power emitted by a power supply at the DC node i, $P_{Li}$ is the active power absorbed by a load at the DC node i, $G_{ij}$ is the admittance between the node i and a node j, $I_{dcrefi}$ is the direct current reference value of the DC node i, $k_{di}$ is a droop coefficient under the current-voltage droop control mode, $U_{dcrefi}$ is the DC voltage reference value of the DC node i, $k_{dpi}$ is a droop coefficient under the active power-voltage droop control mode, $U_{dcj}$ is the DC voltage of the DC node j, and n is the number of nodes; $\alpha$ and $\beta$ are adjustable variables;

updating the current DC node voltage according to the voltage variation obtained by solving the power balance equations, and, if the updated DC node voltage exceeds the limit value, switching the control strategy; and if the updated DC node voltage does not exceed the limit value and the iteration constraints are not satisfied, alternating the main converter station according to the priority until iteration is completed;

after the DC power flow iteration converges, performing power flow calculation of a voltage station, and for a converter station under DC voltage control or droop control, solving the active power and reactive power injected into an AC network by the converter station according to the active power injected into each DC node and a DC node voltage;

acquiring power flow data of an AC system, wherein the power flow data of the AC system comprises power flow data of bus, transformers, AC lines and generators;

performing a power flow calculation of the AC system, and updating voltage and power values of the converter station until the iteration requirements are met; and after the power flow calculation of the AC system ends, updating a voltage amplitude and a phase angle of the bus connected to the converter station.

* * * * *